US008823149B2

(12) United States Patent
Jakubowski et al.

(10) Patent No.: US 8,823,149 B2
(45) Date of Patent: Sep. 2, 2014

(54) CONTACT LANDING PADS FOR A SEMICONDUCTOR DEVICE AND METHODS OF MAKING SAME

(71) Applicant: GlobalFoundries Inc., Grand Cayman, KY (US)

(72) Inventors: Frank Jakubowski, Dresden (DE); Juergen Faul, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/710,575

(22) Filed: Dec. 11, 2012

(65) Prior Publication Data

US 2014/0159125 A1    Jun. 12, 2014

(51) Int. Cl.
   *H01L 23/495*    (2006.01)
   *H01L 21/31*    (2006.01)

(52) U.S. Cl.
   USPC ........................................... 257/666; 438/773

(58) Field of Classification Search
   USPC ................... 438/618, 666, 670; 257/773–776
   See application file for complete search history.

(56) References Cited

U.S. PATENT DOCUMENTS

| | | | |
|---|---|---|---|
| 7,416,973 B2 | 8/2008 | Peters et al. | |
| 7,449,711 B2 * | 11/2008 | Asano et al. | 257/4 |
| 7,510,960 B2 | 3/2009 | Toomey | |
| 7,678,658 B2 | 3/2010 | Yang et al. | |
| 7,678,690 B2 | 3/2010 | Richter et al. | |
| 8,178,931 B2 | 5/2012 | Toomey | |
| 8,338,292 B2 | 12/2012 | Tan et al. | |
| 2008/0048333 A1* | 2/2008 | Seo et al. | 257/773 |
| 2008/0054392 A1 | 3/2008 | Toomey | |
| 2009/0283853 A1 | 11/2009 | Huebinger | |
| 2010/0207213 A1 | 8/2010 | Tan et al. | |
| 2012/0211843 A1 | 8/2012 | Jung et al. | |

* cited by examiner

*Primary Examiner* — Calvin Lee
(74) *Attorney, Agent, or Firm* — Amerson Law Firm, PLLC

(57) ABSTRACT

One device herein includes first and second spaced-apart active regions, a transistor formed in and above the first active region, wherein the transistor has a gate electrode, a conductive contact landing pad that is coupled to the second active region, wherein the contact landing pad is made of the same conductive material as the gate electrode, and a contact that is coupled to the contact landing pad. One method herein includes forming first and second spaced-apart active regions, forming a layer of gate insulation material on the active regions, performing an etching process to remove the gate insulation material formed on the second active region, performing a common process operation to form a gate electrode structure above the gate insulation material on the first active region and the contact landing pad that is conductively coupled to the second active region and forming a contact to the contact landing pad.

11 Claims, 8 Drawing Sheets

CONTACT LANDING PADS FOR A SEMICONDUCTOR DEVICE AND METHODS OF MAKING SAME

BACKGROUND OF THE INVENTION

1. Field of the Invention

The present disclosure generally relates to the manufacture of sophisticated semiconductor devices, and, more specifically, to a novel contact landing pad structure for a semiconductor device, and various methods of making such a contact landing pad.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element used in manufacturing such integrated circuit devices. A field effect transistor, irrespective of whether an NMOS transistor or a PMOS transistor is considered, typically includes doped source and drain regions that are formed in a semiconducting substrate. The source and drain regions are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Over the years, device features, like the channel length, have been steadily decreased in size to enhance the performance of the transistor, e.g., increase its switching speed, and the overall functionality of the circuit. There is a constant drive in the semiconductor manufacturing industry to decrease the physical size of transistor devices, and thus the "footprint" or "real estate" occupied by a particular circuit, while at the same time increasing device performance capability—i.e., there is a constant drive to increase the packing density on integrated circuit products. However, the ongoing shrinkage of feature sizes on transistor devices and the demand for ever higher packing densities causes the pitch between adjacent transistors to also decrease. In turn, this overall increase in packing density limits the size of the conductive contact elements—e.g., those elements that provide electrical connection to the transistor or to active regions in the substrate—and makes accurately landing them where desired more challenging as there is less margin for errors due to, for example, misalignment.

FIGS. 1A-1B are, respectively, a plan view and a cross-sectional view of a portion of an integrated circuit device, that are provided to explain one prior art technique that is employed to form contacts to active regions formed in a semiconducting substrate. Such contacts may be formed for a variety of purposes, e.g., to provide electrical contact to a doped well region formed in an active region. As shown therein, a plurality of isolation structures 12 are formed in the substrate 10 to thereby define active regions 10A, 10B. The isolation structures 12 may be formed by etching trenches into the substrate 10 and thereafter filling the trenches with an insulating material, such as silicon dioxide. Typically, in current-generation devices, the depth 12D of the isolation regions is about 250 nm so as to insure good electrical isolation between adjacent active regions. To insure that the trench can be reliably filled without formation of undesirable voids, the width 12W of the trench where the isolation region 12 will be formed has a minimum size of about 60 nm, i.e., the aspect ratio of the trench is a little greater than 4 (250/60).

Illustrative contacts 14 are depicted on the region 10B. The contacts 14 may take any form or shape, such as the illustrative square post configuration depicted in the drawing or it may take the form of a line-type structure. In general, the width 10W of the active regions 10A, 10B must be large enough to tolerate any potential misalignment between the contact 14 and the active region. What is undesirable is for any portion of the contact 14 to land outside of the active region, i.e., on the isolation region 12. If that situation were to occur, portions of the isolation structure 12 might be consumed in the process of forming the contacts 14, thereby reducing the effectiveness of the isolation region 12 and perhaps leading to the formation of conductive material in undesirable locations that, in a worst case scenario, might lead to device failure.

By way of example, if the contacts 14 have a width 14W of 30 nm, then the active regions 10A, 10B may be formed to a width 10W of about 50 nm so as to accommodate some misalignment between the contact 14 and the active region 10B. Unfortunately, making the active regions 10A, 10B wider so as to insure that the contacts 14 do not land outside of the active regions 10A, 10B increases the pitch 10P between the active regions 10A, 10B. In the example just discussed, the pitch 10P would be 110 nm (50 nm active width+60 nm trench width). This increased pitch 10P means that valuable plot space or "real estate" is consumed for the purpose of forming contacts 14 to active regions 10A, 10B.

The present disclosure is directed to towards a novel contact landing pad structure for a semiconductor device, and various methods of making such a contact landing pad, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed towards a novel contact landing pad structure for a semiconductor device, and various methods of making such a contact landing pad. In one example, the device disclosed herein includes first and second spaced-apart active regions, a transistor formed in and above the first active region, wherein the transistor has a gate electrode, a conductive contact landing pad that is conductively coupled to the second active region, wherein the conductive contact landing pad is made of the same conductive material as the gate electrode, and a contact that is conductively coupled to the conductive contact landing pad.

One illustrative method disclosed herein includes forming first and second spaced-apart active regions in a semiconducting substrate, forming a layer of gate insulation material on the first and second active regions, performing an etching process to remove the layer of gate insulation material formed on the second active region so as to thereby expose the second active region, performing a common process operation to form a gate electrode structure above the layer of gate insulation material on the first active region for the transistor and the conductive contact landing pad that is conductively coupled to the second active region and forming a contact to the conductive contact landing pad.

BRIEF DESCRIPTION OF THE DRAWINGS

The disclosure may be understood by reference to the following description taken in conjunction with the accompanying drawings, in which like reference numerals identify like elements, and in which.

Figure 1A:
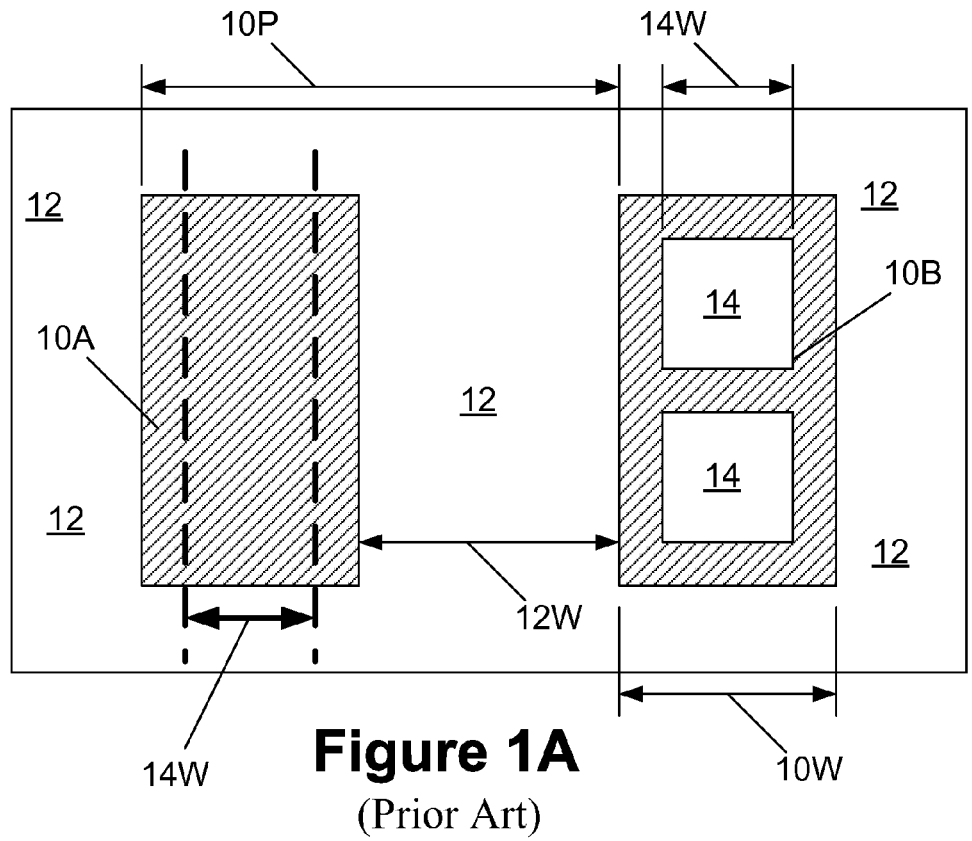
FIGS. 1A-1B schematically depict an illustrative prior art technique for forming contacts to active regions formed in a semiconducting substrate.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to a novel contact landing pad structure for a semiconductor device, and various methods of making such a contact landing pad. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to the attached drawings, various illustrative embodiments of the devices and methods disclosed herein will now be described in more detail.

Figure 2A:
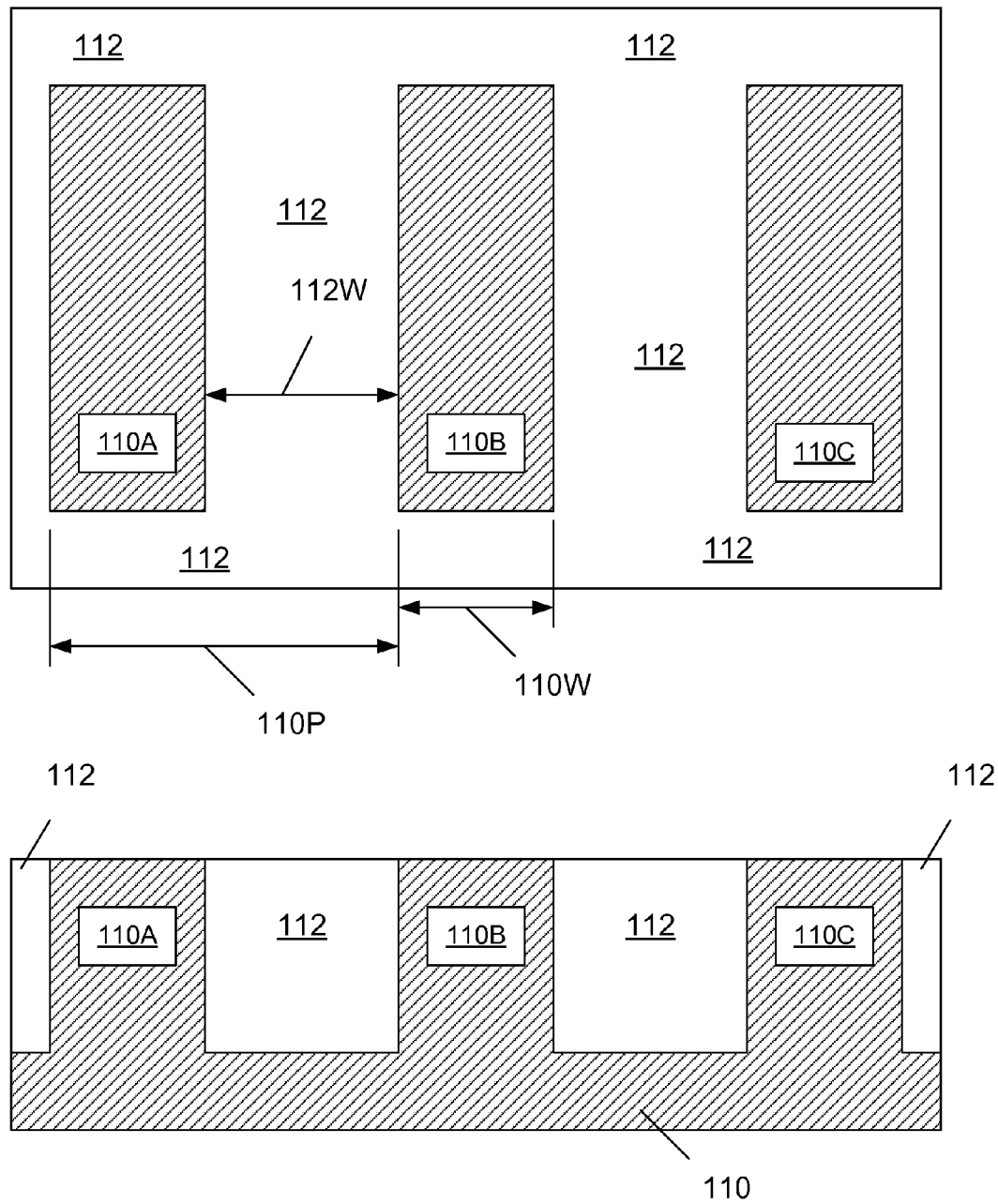
FIGS. 2A-2G depict various illustrative embodiments of a novel contact landing pad structure for a semiconductor device, and various methods of making such a contact landing pad disclosed herein.

FIGS. 2A-2G depict various illustrative embodiments of the novel contact structure disclosed herein. Each of the figures contains a plan view and a cross-sectional view of an illustrative integrated circuit product. As shown in FIG. 2A, a plurality of isolation structures 112 have been formed in a semiconducting substrate 110 to thereby define a plurality of illustrative active regions 110A, 110B and 110C. As described more fully below, an illustrative transistor will be formed in and above the active region 110C, while the novel contact landing pad will be formed on the active regions 110A, 110B. Of course, the active regions 110A-110C need not be adjacent one another as depicted in the drawings as they may be spaced apart from one another and positioned at various locations across the substrate 110. The isolation structures 112 may be formed by performing known prior art techniques, e.g., by etching trenches into the substrate 110 and thereafter filling the trenches with an insulating material, such as silicon dioxide. In current-generation devices, the isolation structures 112 may have a minimum width 112W of about 60 nm to insure that the trench may be reliably filled with insulating material. In one illustrative embodiment, the semiconducting substrate 110 may be a bulk semiconductor material or it may have a silicon-on-insulator (SOI) configuration comprised of bulk silicon, a buried insulation layer (commonly referred to as a "BOX" layer) and an active layer (in and above which semiconductor devices are formed), which may also be a silicon material. Of course, the present invention may also be employed when the substrate 110 is made of semiconducting materials other than silicon and/or it may be in another form, such as a bulk silicon configuration. Thus, the terms "substrate" or "semiconducting substrate" should be understood to cover all forms of semiconductor structures and materials.

Figure 1B:
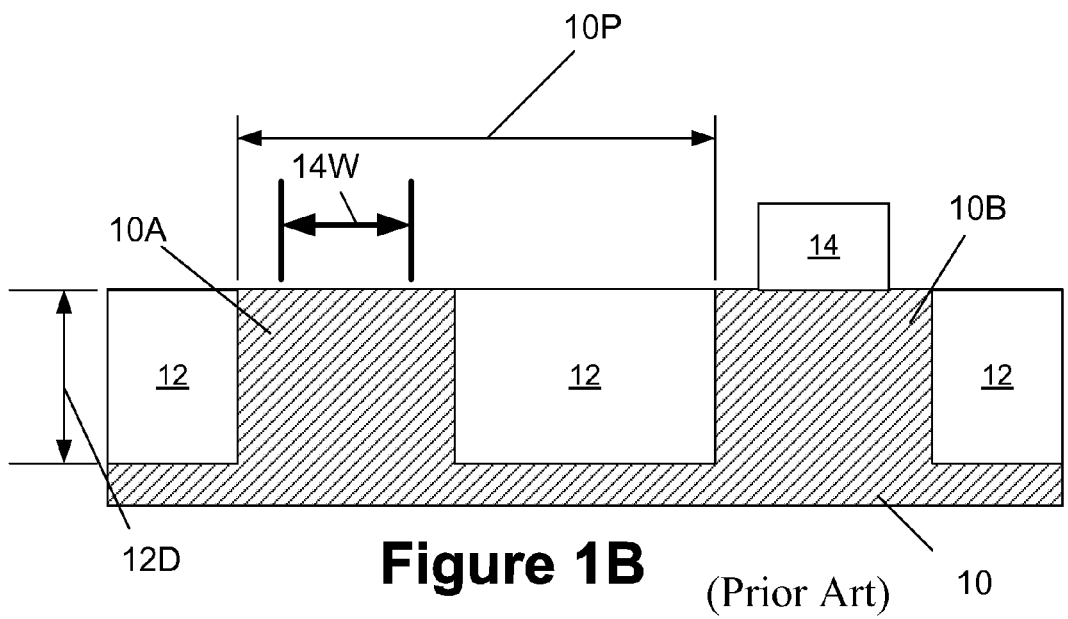

Although the drawings are not to scale, in one illustrative example, the active regions 110A-C may each have a width 110W of 30 nm which results in an active pitch 110P of 90 nm. Importantly, as discussed more fully below, using the novel landing pads disclosed herein, the width 110W of the active regions 110A-C and the pitch 110P between active regions may be reduced as compared to those dimensions discussed with reference to FIGS. 1A-1B while still providing a landing pad structure that provides a margin for error as it relates to forming conductive contacts to the active regions 110A, 110B. Thus, using the landing pad structures disclosed herein, the packing density on integrated circuit products may be increased while still accommodating potential misalignment when forming conductive contacts to those active regions.

Figure 2B:
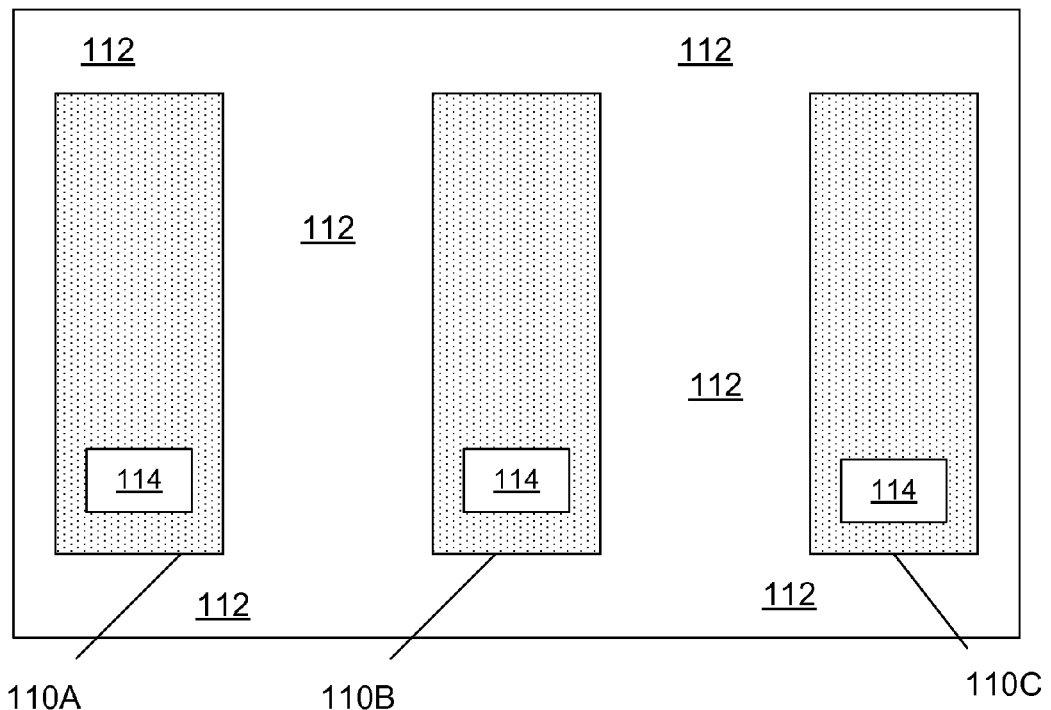
Figure 2B:
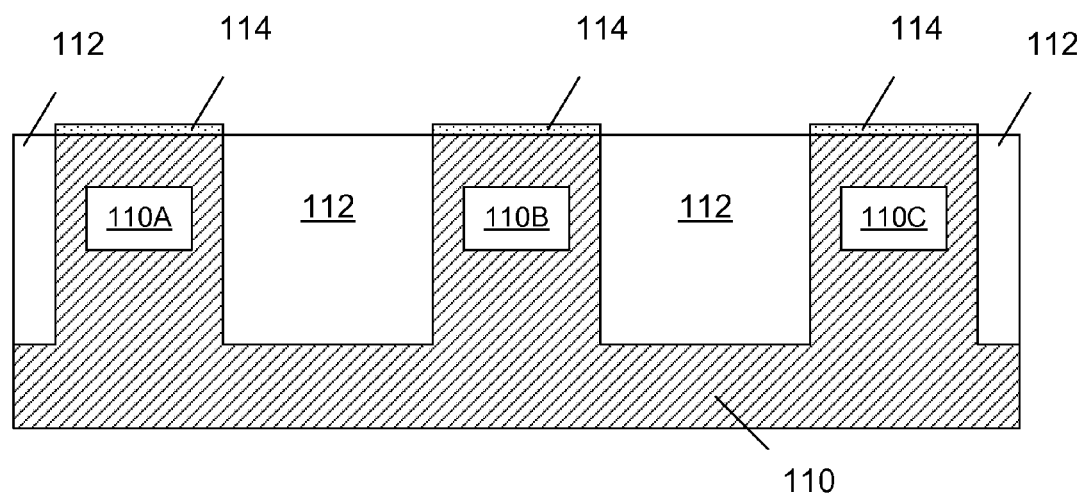

FIG. 2B depicts the device at the point of fabrication wherein a gate insulation layer 114 has been formed on the active regions 110A-C. The gate insulation layer 114 may be formed from a variety of materials and it may be formed using a variety of techniques. In one illustrative example, the gate insulation layer 114 is a layer of silicon dioxide that is formed by performing a thermal oxidation process.

Figure 2C:
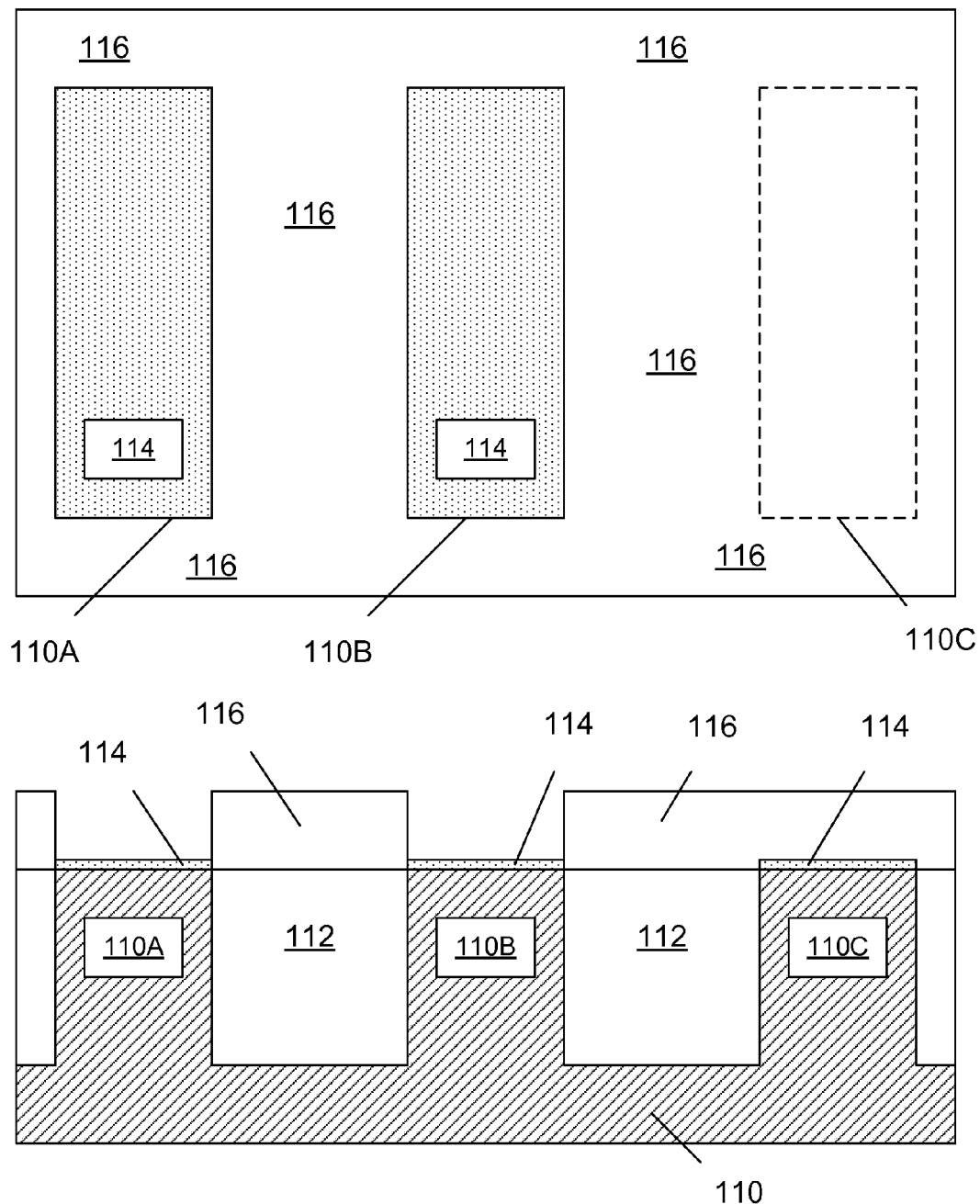

FIG. 2C depicts the device after a patterned etch mask layer 116 has been formed above the device. The patterned etch mask layer 116 may be a patterned photoresist mask or a patterned hard mask. The patterned etch mask layer 116 covers the active region 110C (where the transistor will be formed) and exposes the gate insulation layers 114 formed above the active regions 110A-B for further processing.

Figure 2D:
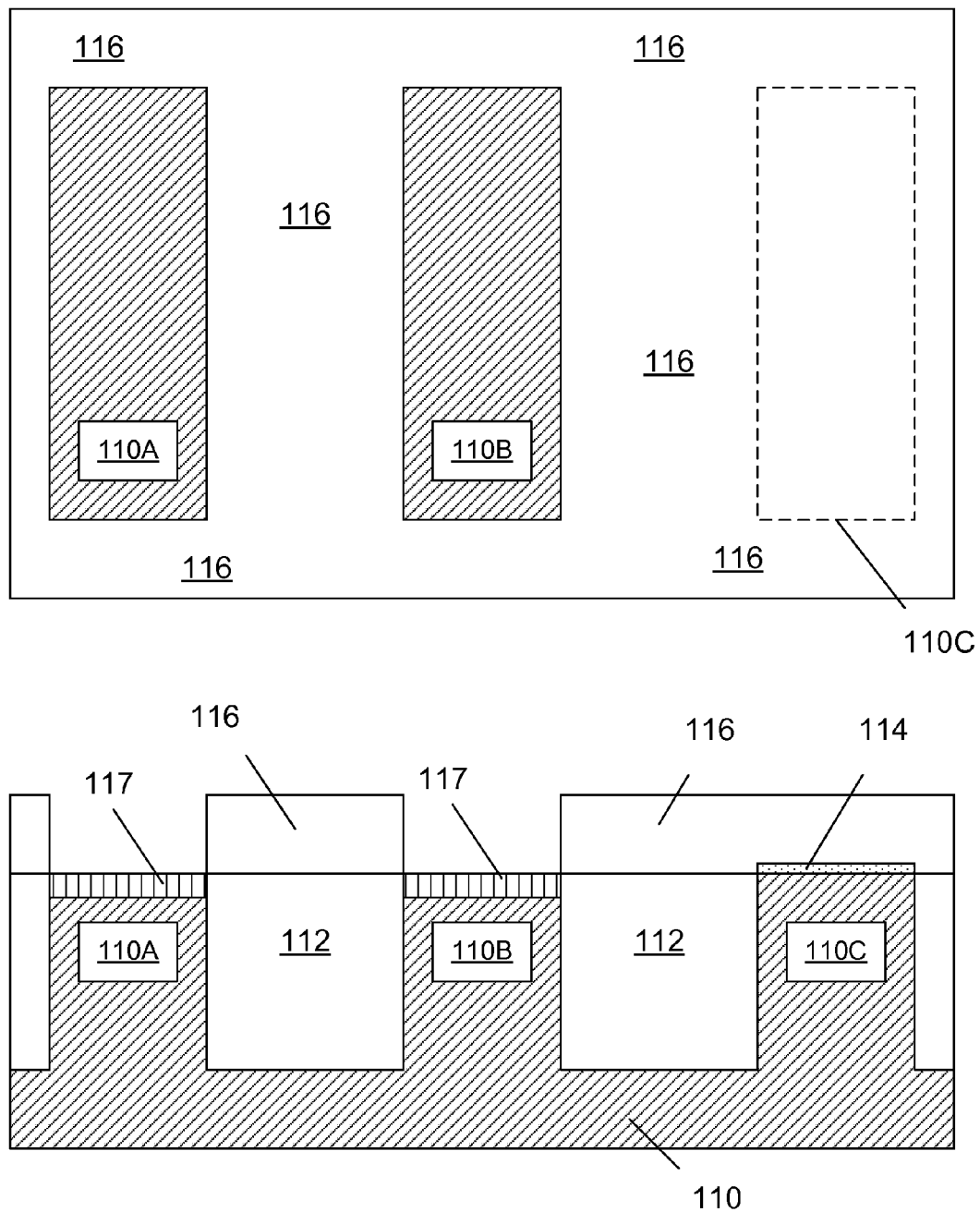

FIG. 2D depicts the device after several process operations have been performed. Initially, an etching process was performed to remove the exposed gate insulation layer 114 from above the active regions 110A, 110B. In some embodiments, optional doped regions 117 may be formed in the active regions 110A, 110B, as part of the process of forming the novel contact landing pad disclosed herein. Depending upon the particular application, the doped regions 117 may be doped with P-type or N-type dopant materials. The doped regions 117 may be formed using one of two illustrative techniques—ion implantation or diffusion. In one embodiment, after the active regions 110A, 110B are exposed, an ion implantation process may be performed through the patterned mask layer 116 to implant dopant materials into the exposed portions of the active regions 110A, 110B to thereby form the doped regions 117. Such an ion implantation process may be performed using a dopant dose that falls within the range of about $10E^{14}$-$10E^{16}$ ions/cm$^2$, and it may be performed at an energy level that falls within the range of about 2-20 keV. As another alternative, the conductive material that will become the contact landing pad and the conductive gate electrode for the transistor (as described more fully below) may, in some embodiments, be formed using an in situ doping deposition process wherein dopant materials are introduced into the conductive material, e.g., polysilicon, as it is being formed. If the in situ approach is taken, the doped regions 117 will be formed as a result of dopant materials migrating from the doped conductive material as subsequent processing operations, particularly subsequent heating or anneal processes, are performed to complete the manufacture of the device. In one illustrative example, irrespective of the manner in which it is formed, the doped regions 117 may have a dopant concentration that falls within the range of about $10E^{20}$-$10E^{21}$ dopands/cm$^3$. In general, the purpose of the doped regions 117 is to form a contact with the gate stack material. So as not to obscure the present invention, the doped regions 117 are not shown in subsequent drawings.

Figure 2E:
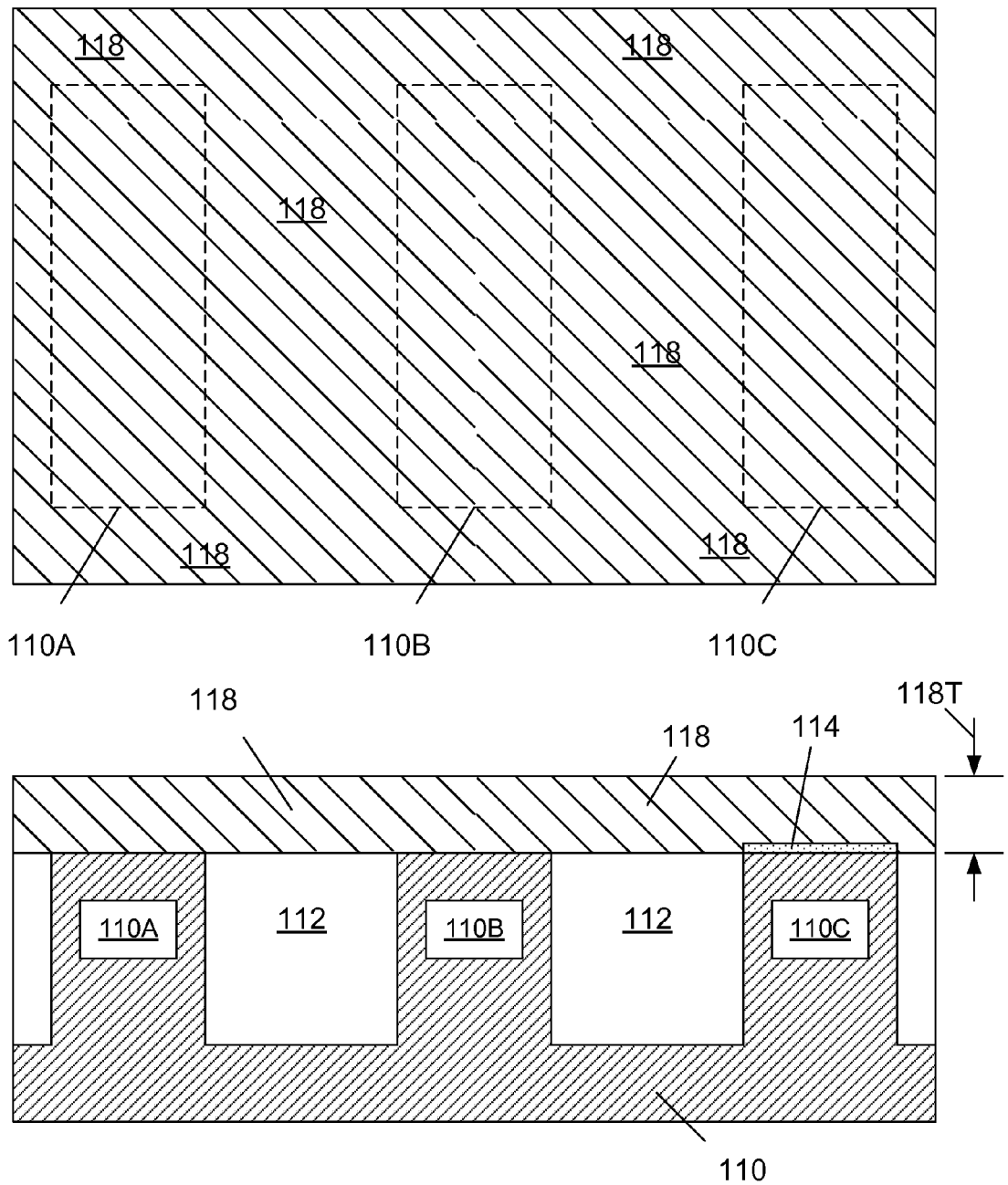

Next, as shown in FIG. 2E, a layer of conductive material 118 is formed across the device. The layer of conductive material 118 may be formed from a variety of different materials, e.g., one or more layers of metal, polysilicon, amorphous silicon, etc. The layer of conductive material 118 may be a single homogenous layer of material or it may be multiple layers of material. Importantly, as described more fully below, the novel contact landing pads disclosed herein, that will conductively contact the active regions 110A-B, and the gate electrode for the transistor that will be formed above the active region 110C, will be made from this same layer of conductive material 118. The layer of conductive material 118 may be formed using a variety of known techniques, chemical vapor deposition (CVD), physical vapor deposition (PVD), etc., and its thickness 118T may vary depending upon the particular application, e.g., 50-70 nm.

Figure 2F:
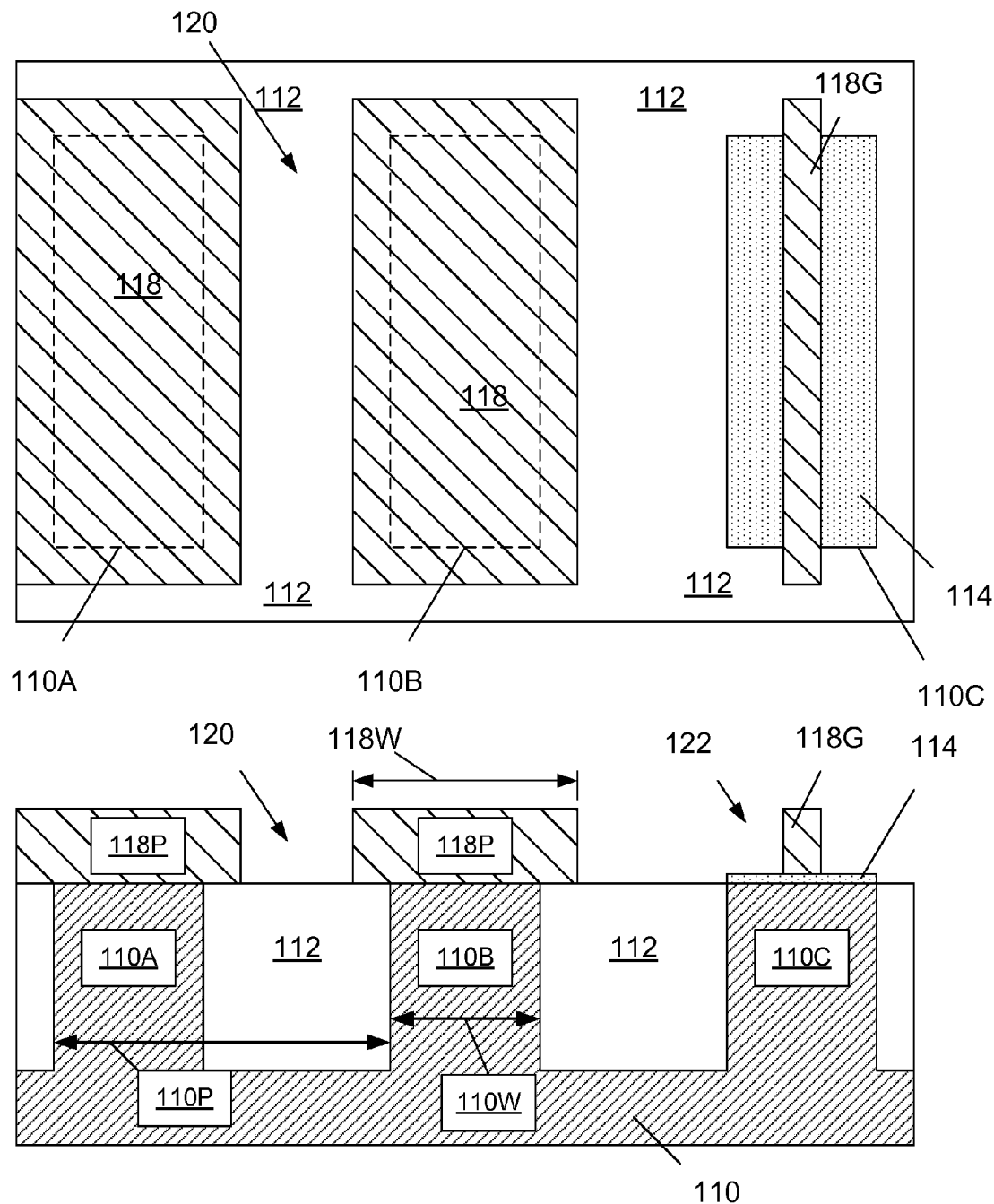

Next, as shown in FIG. 2F, the layer of conductive material 118 is patterned so as to define a gate electrode 118G for the transistor 122 to be formed above the active region 110C and a plurality of contact landing pads 118P that are conductively coupled to the active regions 110A-110B. Note that the contact landing pads 118P have a horizontal cross-sectional width 118W that is greater that the horizontal cross-sectional width 110W of the active regions 110A-B. For example, in one illustrative embodiment, the width 118W may be about 50 nm, while the width 110W may be about 30 nm. An opening 120 is formed between the contact landing pads 118P. In the example where the isolation structures 112 have a width of 60 nm, the active regions 110A-B have a width of 30 nm and the contact landing pads 118P have a width of 50 nm, the openings 120 have a width of about 40 nm. Assuming the layer of conductive material 118 is no greater than, for example, 100 nm thick, the aspect ratio of the opening 120 may be about 2.5 that may be readily filled using traditional deposition processes. Note that the contact landing pads 118P and the gate electrode 118G have substantially the same vertical thickness. Of course, the numbers set forth herein are only provided for purposes of explanation and the inventions disclosed herein should not be considered to be limited to any particular dimensions for the various structures disclosed herein. From the foregoing it can be seen that, as compared to the prior art structures shown in FIGS. 1A-B, through use of the novel contact landing pads 118P disclosed herein, the active pitch 110P has been desirably reduced so as to thereby increase packing density, while still providing a landing pad with sufficient width 118W, e.g., 50 nm, so as to allow for some misalignment when contacts 130 (see FIG. 2G) are formed that are conductively coupled to the active regions 110A-B through the landing pads 118P.

Figure 2G:
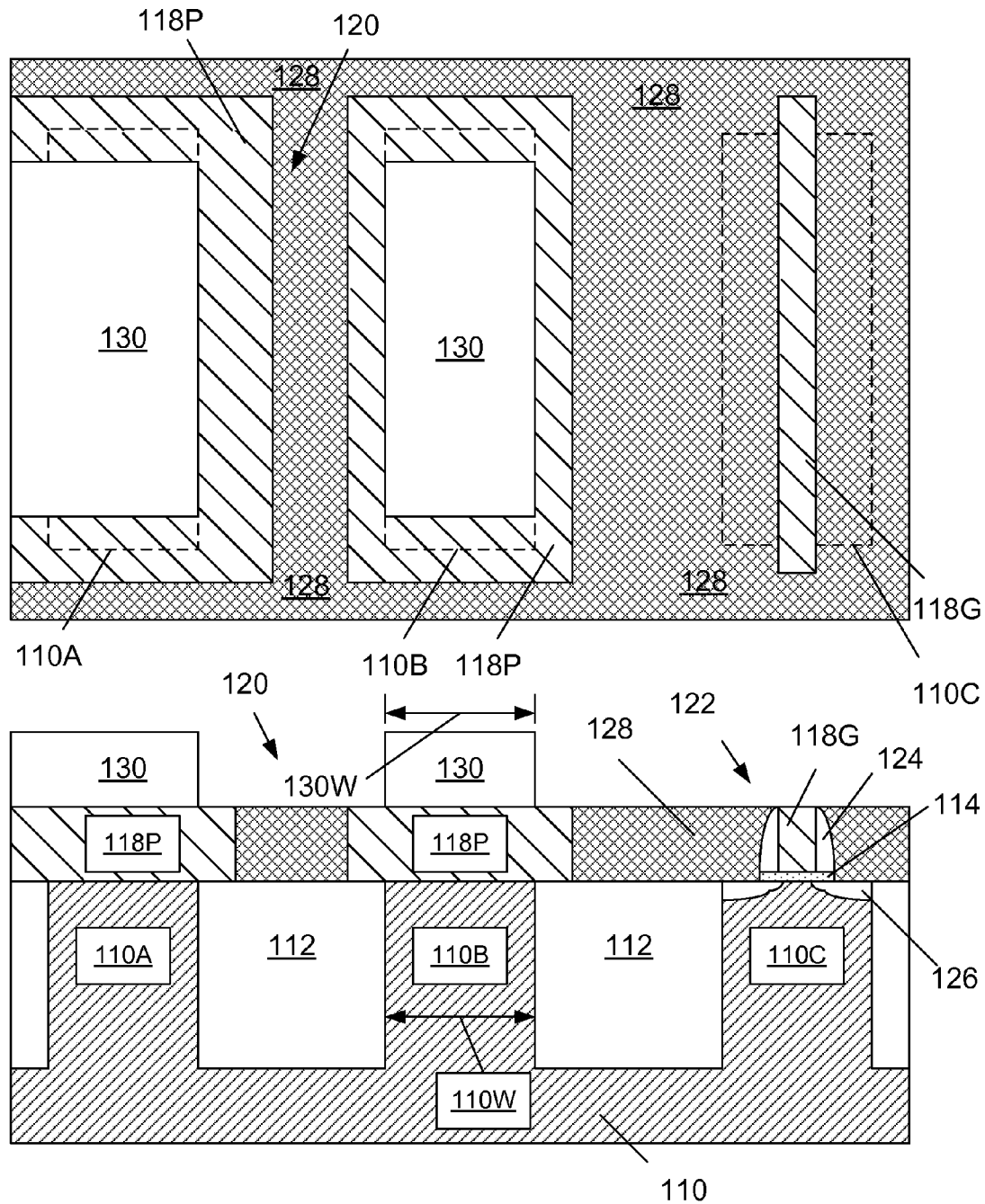

FIG. 2G depicts the device after several process operations have been performed. Initially, several traditional process operations were performed to manufacture the transistor 122 above the active region 110C. For example, after the gate electrode 118G was formed, a so-called extension ion implant process was performed (using the appropriate dopant atoms) to form so-called extension implant regions in the active region 110C. Then, sidewall spacers 124, made of a material such as silicon nitride, were formed adjacent the gate electrode 118G by depositing a layer of spacer material and performing an anisotropic etching process. After the spacers 124 were formed, another ion implantation process was performed (using the appropriate dopant atoms) to form so-called source/drain implant regions in the active region 110C. The extension implant process and the source/drain implant process result in the formation of the illustratively depicted source/drain regions 126 shown in FIG. 2G. Thereafter, a layer of insulating material 128, e.g., silicon dioxide, was blanket-deposited across the device and a chemical mechanical polishing (CMP) process was performed to planarize the upper surface of the layer of insulating material 128 with the upper surface of the contact landing pads 118P and the gate electrode 118G. Thereafter, illustrative conductive contacts 130 were formed using traditional techniques, e.g., deposition/etch, damascene techniques, etc. In the depicted example, the contacts 130 are line-type features, although they could equally be post-type features such as the post 14 depicted in the background section of this application. In some embodiments, the contacts 130 may have a horizontal cross-sectional width 130W that is about equal to or greater than the horizontal cross-sectional width 110W of the active regions 110A-B. At the point of fabrication depicted in FIG. 2G, traditional manufacturing operations may be performed to complete the manufacture of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    first and second spaced-apart active regions formed in a semiconducting substrate;
    a transistor formed in and above said first active region, said transistor comprising a gate electrode made of a conductive material;
    a conductive contact landing pad that is conductively coupled to said second active region, wherein said conductive contact landing pad is made of the same conductive material as said gate electrode, wherein said second active region has a first horizontal cross-sectional width and said conductive contact landing pad has a second horizontal cross-sectional width that is greater than said first horizontal cross-sectional width; and
    a contact that is conductively coupled to said conductive contact landing pad.

2. The device of claim 1, wherein said conductive material is one of a metal, polysilicon or amorphous silicon.

3. The device of claim 1, wherein said contact has a horizontal cross-sectional width that is equal to or greater than said first horizontal cross-sectional width of said second active region.

4. The device of claim 1, wherein said contact is one of a line-type feature or a post-type feature.

5. The device of claim 1, further comprising a doped region formed in said second active region.

6. The device of claim 1, wherein said conductive contact landing pad and said gate electrode have substantially the same vertical thickness.

7. A device, comprising:
    first and second spaced-apart active regions formed in a semiconducting substrate, said second active region having a first horizontal cross-sectional width;
    a transistor formed in and above said first active region, said transistor comprising a gate electrode made of a conductive material;
    a conductive contact landing pad that is conductively coupled to said second active region, wherein said conductive contact landing pad is made of the same conductive material as said gate electrode, said conductive contact landing pad having a second horizontal cross-sectional width that is greater than said first horizontal cross-sectional width and wherein said conductive contact landing pad and said gate electrode have substantially the same vertical thickness; and
    a contact that is conductively coupled to said conductive contact landing pad.

8. The device of claim 7, wherein said conductive material is one of a metal, polysilicon or amorphous silicon.

9. The device of claim 7, wherein said contact has a horizontal cross-sectional width that is equal to or greater than said first horizontal cross-sectional width of said second active region.

10. The device of claim 7, wherein said contact is one of a line-type feature or a post-type feature.

11. The device of claim 7, further comprising a doped region formed in said second active region.

* * * * *